(12) United States Patent
Altmanshofer et al.

(10) Patent No.: US 6,420,918 B2
(45) Date of Patent: Jul. 16, 2002

(54) PHASE CONTROL FOR OSCILLATORS

(75) Inventors: Robert Dale Altmanshofer; Michael Evan Crabb, both of Carmel, IN (US)

(73) Assignee: Thomson Licensing S.A., Boulogne Cedex (FR)

( * ) Notice: Subject to any disclaimer, the term of this patent is extended or adjusted under 35 U.S.C. 154(b) by 0 days.

(21) Appl. No.: 09/957,928

(22) Filed: Sep. 21, 2001

Related U.S. Application Data (63) Continuation of application No. 09/563,478, filed on May 2, 2000.

(51) Int. Cl.$^7$ ................................................ H03L 7/06
(52) U.S. Cl. ............................................ 327/156; 327/9
(58) Field of Search .......................... 327/2–12, 91–95, 327/147, 150, 156, 159

(56) References Cited

U.S. PATENT DOCUMENTS

| | | | |
|---|---|---|---|
| 5,459,756 A | 10/1995 | Stilwell et al. | 375/376 |
| 5,796,392 A | 8/1998 | Eglit | 345/213 |
| 6,091,304 A | 7/2000 | Harrer | 331/10 |

OTHER PUBLICATIONS

Fairchild Semiconductor—Nov. 1983 Revised Jan. 1999 CD4051BC CD4052BC CD4053BC Single 8–Channel Analog Multiplexer/Demultiplexer. Dual 4–Channel Analog Multiplexer/Demultiple. Dual 4–Channel Analog Multiplexer/Demultiplexer Triple 2–Channel Analog Multiplexer/Demultiplexer.

*Primary Examiner*—Kenneth B. Wells
*Assistant Examiner*—Cassandra Cox
(74) *Attorney, Agent, or Firm*—Joseph S. Tripoli; Joseph J. Laks; Harvey D. Fried (57) ABSTRACT

A phase locked loop, comprising: a controllable oscillator requiring a control signal having a given bias voltage for generating a clock signal; an integrator for developing the control signal; a source of an external synchronizing signal; first and second voltage sources defining a voltage potential related to the given bias voltage; a first switch coupled to the first and second voltage sources and responsive to the clock signal for developing a regenerated clock signal having a peak to peak voltage determined by the voltage potential; and, a second switch responsive to the external synchronizing signal for periodically sampling portions of the regenerated clock signal and coupling the sampled portions to the integrator, the sampled portions charging and discharging the integrator to generate the control signal with a large enough magnitude to provide the given bias voltage, said first and second switches forming a phase detector.

25 Claims, 6 Drawing Sheets

PRIOR ART

PHASE CONTROL FOR OSCILLATORS

CROSS REFERENCE TO RELATED APPLICATIONS

This is a continuation of copending application Ser. No. 09/563,478, filed May 2, 2000.

BACKGROUND OF THE INVENTION

This invention relates to the field of synchronizing oscillators, and in particular, to a phase locked loop having a phase detector for generating upwardly scaled control voltages.

Figure 6:
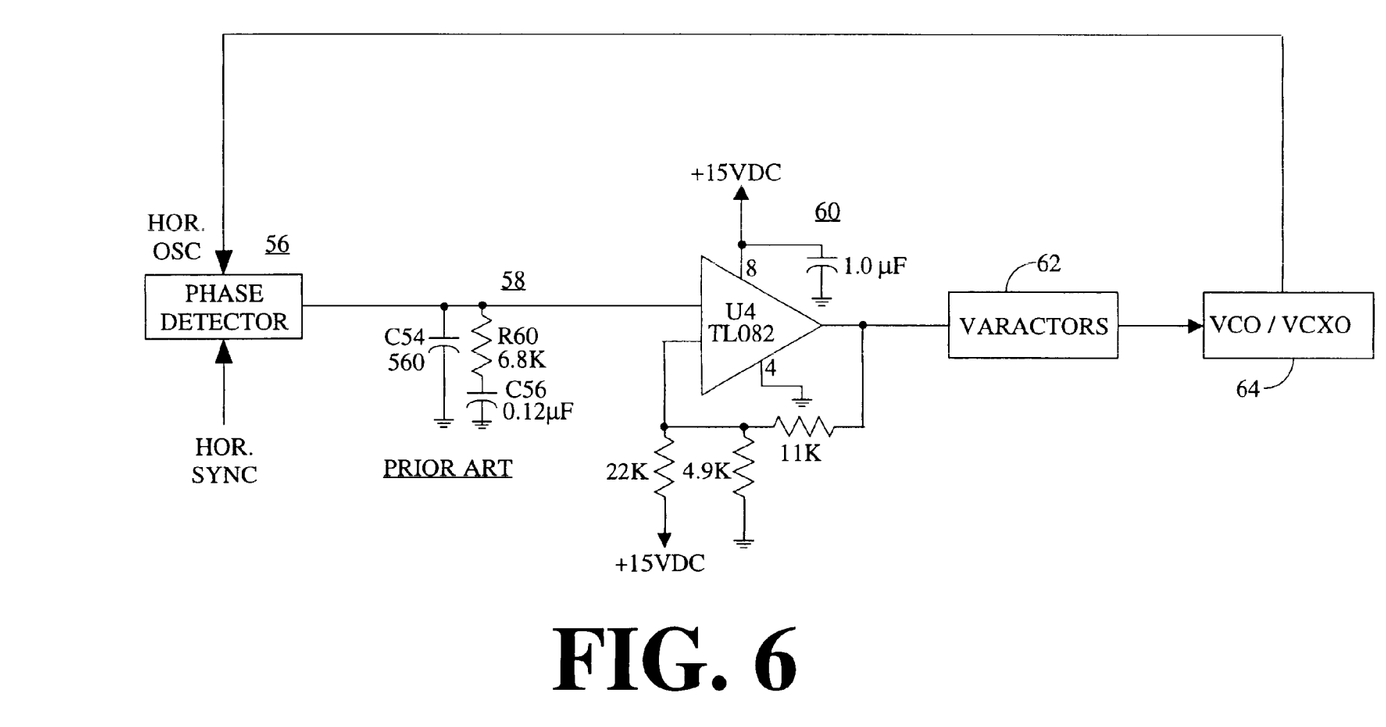
FIG. 6 illustrates a prior art arrangement including a phase detector and amplitude scaler for driving varactors.

Many voltage controlled oscillators (VCO), particularly crystal oscillators (VCXO), are controlled by varactors. A varactor can be described as a reverse biased diode that exhibits a capacitance dependent upon the magnitude of the reverse bias voltage applied to it. The resonant frequency of the oscillator can be controlled by the bias voltage. Insufficient bias voltage to attain a given operating frequency or range of frequencies can present a serious problem. This situation is illustrated in FIG. 6, which shows a phase locked loop. A phase detector 56 has the output of a horizontal oscillator and a horizontal synchronizing component as respective inputs. Current flows between the output of the phase detector and an integrator 58, often formed by two capacitors and resistor as shown.

Varactors 62 control a voltage controlled oscillator 64. The varactors require, for example, a bias voltage up to +15 volts DC, but the control voltage developed by the integrator 58 is too small. Accordingly, an operational amplifier 60 is interposed between the integrator 58 and the varactors 62 to scale up, that is, to increase the magnitude of the control voltage to 15 volts, the supply voltage for the operational amplifier. The need for a separate scaler increases the complexity and cost of the phase locked loop, and moreover, requires that the design of each phase locked loop be re-engineered.

There is a long-felt need for a phase detector that can directly supply control voltages at a variety of voltages and/or over different ranges of voltages. Moreover, there is a long-felt need to provide a phase locked loop that can utilize such a phase detector in a simplified, less expensive arrangement that can easily be modified to accommodate different desired voltages and ranges of voltages.

SUMMARY OF THE INVENTION

In accordance with the inventive arrangements the output of a phase detector can advantageously directly generate the range of voltage required for the VCO or VCXO varactors.

A phase locked loop in accordance with the inventive arrangements comprises: means requiring a control signal having a given bias voltage for generating a clock signal; an integrator for developing the control signal; a source of an external synchronizing signal; first and second voltage sources defining a voltage potential related to the given bias voltage; a first switch coupled to the first and second voltage sources and responsive to the clock signal for developing a regenerated clock signal having a peak to peak voltage determined by the voltage potential; and, a second switch responsive to the external synchronizing signal for periodically sampling portions of the regenerated clock signal and coupling the sampled portions to the to the integrator, the sampled portions charging and discharging the integrator to generate the control voltage with a large enough magnitude to provide the given bias voltage, whereby the clock signal generating means is synchronized to the external synchronizing signal.

The phase locked loop can advantageously further comprise: the integrator developing a first control voltage; a source of a second control voltage; a third switch defining a first switchable path between the integrator and the clock signal generating means, and defining a second switchable path between the source of the second control voltage and the integrator, the first or the second switchable path being closed responsive to a control voltage source selection signal. The first control voltage can be coupled to the clock signal generating means for a phase locked mode of operation and the second control voltage can be coupled to the clock signal generating means for a phase unlocked mode of operation.

The first, second and third switches can advantageously be analog semiconductor switches, and further, can advantageously be embodied in an integrated circuit.

DETAILED DESCRIPTION OF THE PREFERRED EMBODIMENTS

A phase detector with the added functionality of a voltage scaler, in accordance with the inventive arrangements, satisfies the long-felt needs of the prior art to improve and simplify the design of phase locked loops. The need for a separate voltage scaler is ended.

Figure 1:
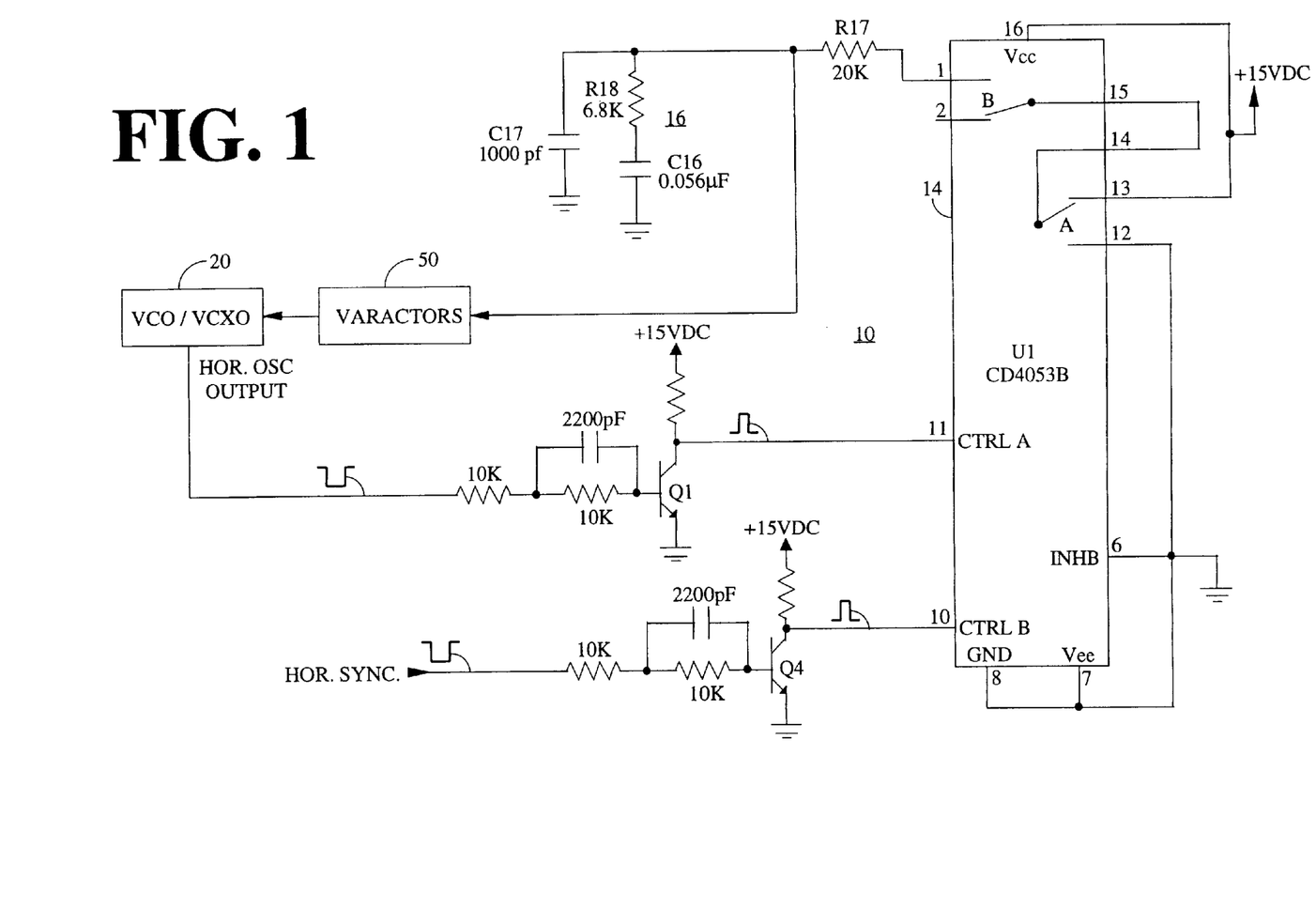
FIG. 1 is a circuit diagram, partially in block form, of a phase detector in accordance with the inventive arrangements.

FIG. 1 illustrates a phase locked loop 10 for synchronizing a voltage controlled oscillator to the horizontal synchronizing component of a video signal, utilizing a phase detector in accordance with the inventive arrangements. A voltage controlled oscillator (VCO) or voltage controlled crystal oscillator (VCXO) 20 is controlled by varactors 50. The varactors require a certain voltage or voltage range to assure that the oscillator can attain a desired operational frequency. In this case, the voltage required by the varactors is +15 volts DC. The varactors 50 are controlled by a control voltage developed by an integrator 16. The integrator 16 is charged and discharged by the output current of a phase detector 14, comprising a plurality of analog switches. The term analog switch is intended to include, for example, semiconductor switches of the kind that can be embodied in an integrated circuit. An example of a suitable integrated circuit is a multiple analog switch integrated circuit, for example a CD4053B analog multiplexer U1 or its equivalent. The phase detector has a first input for receiving the output of the oscillator. The input is the control pin for switch A. In order to assure proper operation of the switch, the horizontal oscillator output signal switches a transistor Q1 on and off and the transistor Q1 operates the switch. The phase detector has a second input for receiving a horizontal synchronizing component of a video signal. The input is the control pin for switch B. In order to assure proper operation of the switch, the horizontal synchronizing component switches a transistor Q4 on and off and the transistor Q4 operates the switch.

It will be assumed for purposes of illustration in FIG. 1 that the oscillator and the horizontal synchronizing component both have a nominal frequency of 1 fH, approximately 15.735 KHz in the NTSC system. It will also be assumed, as is often the case, that a prior art phase detector cannot directly generate a control voltage as large as +15 volts DC.

The input contacts of switch A, pins 12 and 13, are coupled to ground and +15 volts respectively. The common contact of switch A, pin 14, is alternately coupled to pins 12 and 13, and in turn to ground and +15 volts DC respectively. Switch A is controlled responsive to the horizontal oscillator output signal acting through transistor Q1, applied to pin 11. The voltage at pin 15 is illustrated by the uppermost waveform in FIG. 2. The common contact of switch A, pin 14, is coupled to the common contact of switch B, pin 15, as an input signal.

Switch B is controlled by transistor Q4 responsive to the horizontal synchronizing component, applied to pin 10. The voltage at pin 15 is illustrated by the uppermost waveform in FIG. 2. One output contact of switch B, pin 1, is coupled to the phase detector filter 16, embodied by capacitors C16 and C17 and resistor R18. The other output contact of switch B, pin 2, is open. The voltage at pin 10 is illustrated by the middle waveform in FIG. 2.

Figure 2:
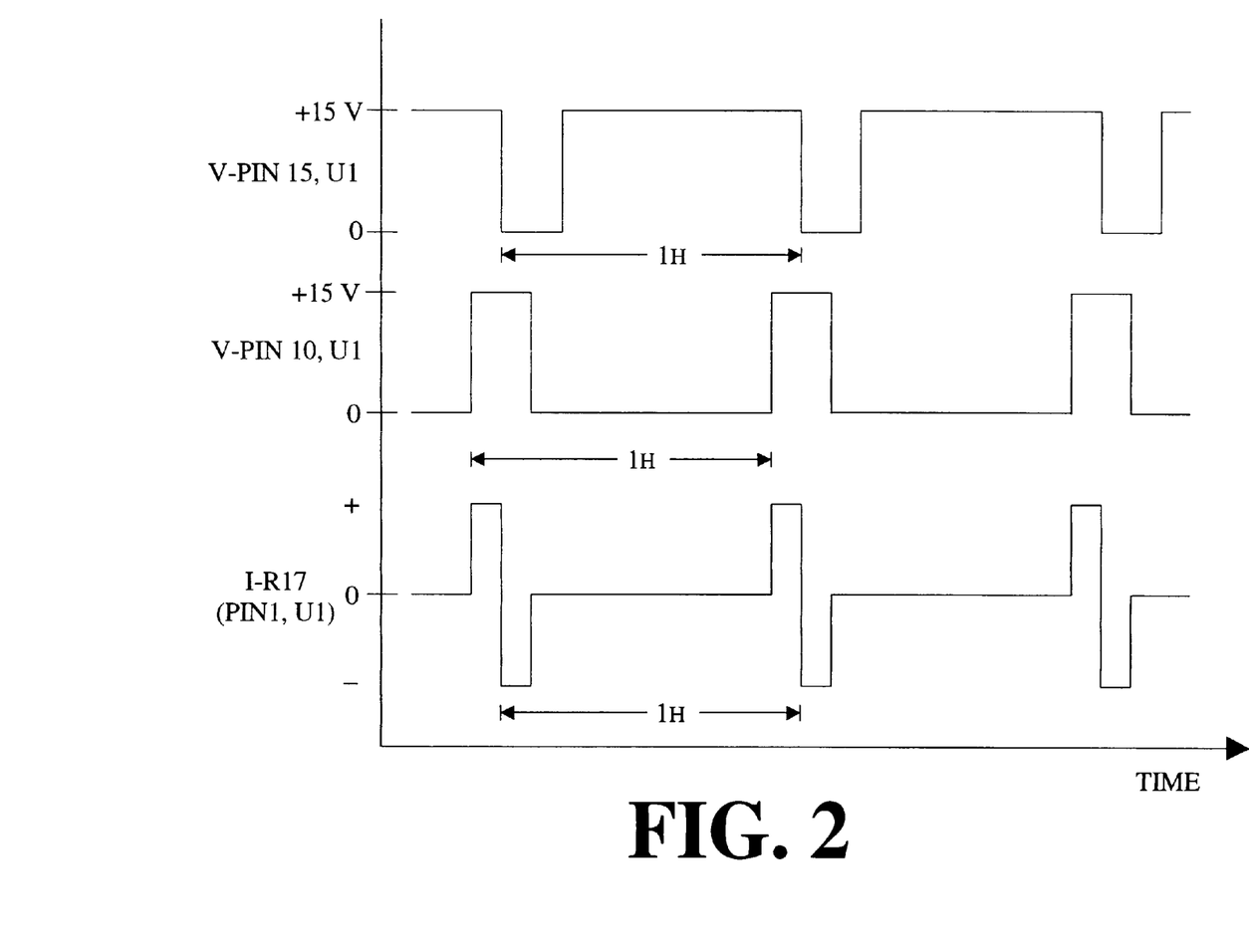
FIG. 2 illustrates waveforms useful for explaining operation of the phase detector in FIG. 1.

The current through resistor R17, and pin 1, is illustrated by the lower waveform in FIG. 2. When the voltages at pins 10 and 15 are both positive, the charge and discharge current is positive. When the voltage at pin 10 is positive and the voltage at pin 15 is negative, the charge and discharge current is negative. When the pulses of the horizontal synchronizing component occur, the integrator is charged or discharged. When the horizontal synchronizing component pulses do not occur, the input to the integrator floats. The magnitudes of the phase detector filter charge and discharge currents are primarily determined by the value of resistor R17, presently 20K. In the phase-locked condition the average value of the charge and discharge currents are equal. It can be seen from FIG. 2 that the synchronizing signal on pin 10 samples every pulse of the oscillator signal on pin 15, thus causing the positive and negative currents at resistor R17/pin 1. The integrated current at pin 1 need not be scaled up in magnitude to drive the varactors of a VCO or VCXO because the necessary bias voltage is advantageously provided by the potential across pins 12 and 13.

The sampling action of the phase detector suggests a useful alternative for describing the phase locked loop. A means for requiring a control signal having a given bias voltage for generating a clock signal can be embodied as the varactor and the controllable oscillator. The integrator develops the control signal. A source of an external synchronizing signal need not necessarily be a horizontal synchronizing component. The phase detector can be embodied as first and second switches. First and second voltage sources, for example ground and +15 volts DC, define a voltage potential related to the given bias voltage. The first switch is coupled to the first and second voltage sources and is responsive to the clock signal for developing a regenerated clock signal having a peak to peak voltage determined by the voltage potential. The second switch is responsive to the external synchronizing signal for periodically sampling portions of the regenerated clock signal and coupling the sampled portions to the integrator. The sampled portions, for example, charge and discharge the integrator to generate the control voltage with a large enough magnitude to provide the given bias voltage. The phase detector formed by the first and second switches synchronizes the clock signal generating means to the external synchronizing signal.

Figure 3:
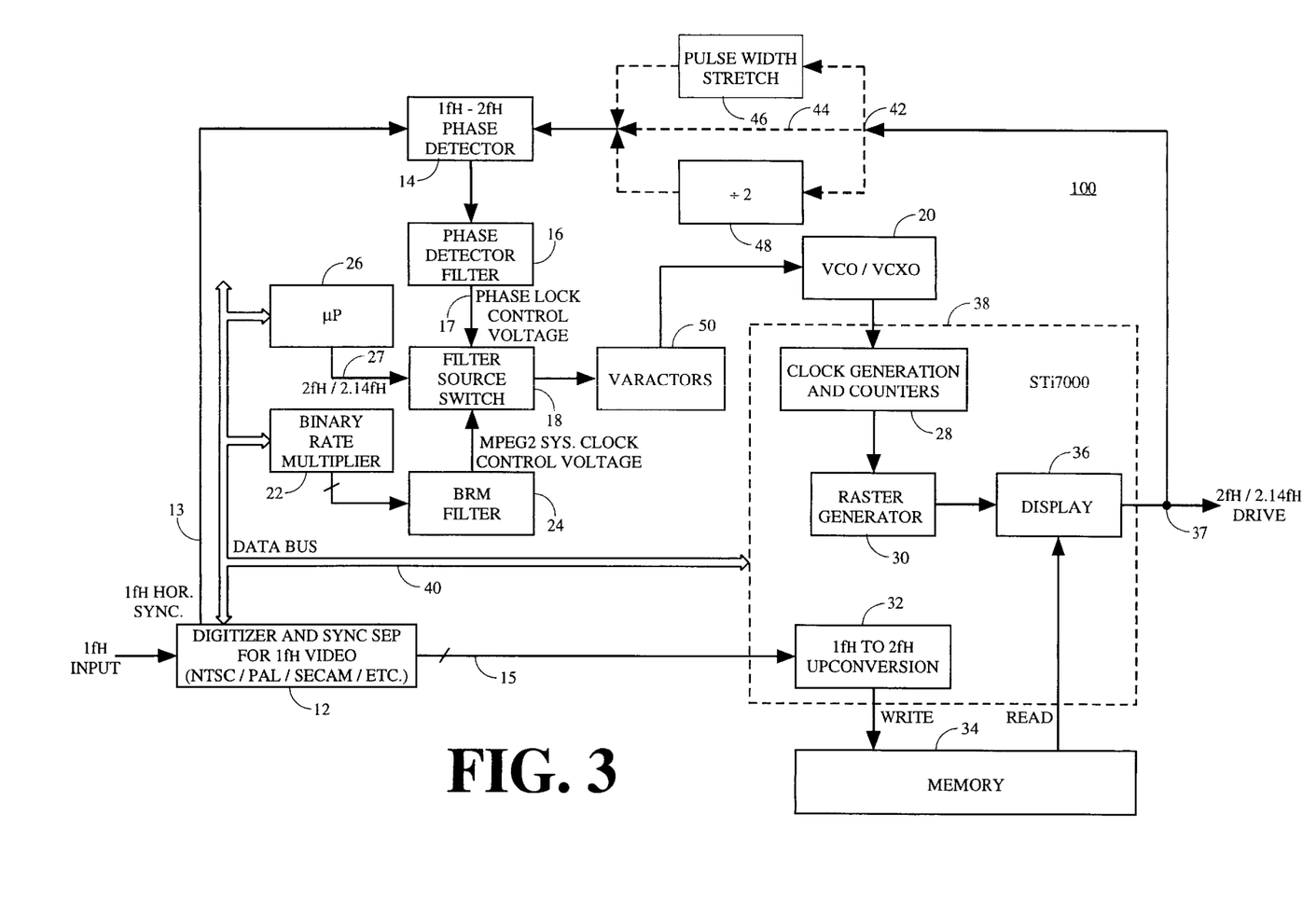
FIG. 3 is a block diagram of a switched source horizontal synchronizing system including a phase detector in accordance with the inventive arrangements.

The phase detector explained in connection with FIGS. 1 and 2 can be advantageously utilized in a multiple frequency horizontal synchronizing system, as shown in FIG. 3. The system 100 has selectable modes of operation including an open loop and a closed loop control path for an oscillator 20. Oscillator 20 can, for example, be a voltage controlled oscillator (VCO) or a voltage controlled crystal oscillator (VCXO). The oscillator is controlled by varactors 50. Open loop control is used for displaying digital video signals, for example in MPEG2 format. The oscillator 20 operates at 13.5 MHz, which is then doubled to 27 MHz and used as the reference for an 81 MHz pixel display clock and the MPEG2 system clock.

The open loop control path begins with a microprocessor ($\mu$P) 26 that supplies a digital frequency control value to a binary rate multiplier (BRM) over a data bus 40. The digital frequency control value is converted to an MPEG2 system clock control voltage by a BRM filter 24. The output of BRM filter 24 on line 25 is a first input to a filter source switch 18. The MPEG2 system clock control voltage is supplied to the oscillator 20 from filter source switch 18 responsive to a 2 fH/2.14 fH selection signal generated by the microprocessor 26. The BRM filter input represents the control signal used for 2.14 fH deflection. The selection signal is illustrated as a direct wire connection, but selection control can also be implemented by the data bus 40 or by a serial data and control bus of the kind having SDA and SCL signals, not shown.

A clock generation and counters circuit 28 is responsive to the output of the oscillator 20. A raster generator is responsive to the clock generation and counters circuit 28, and in turn, drives a display circuit 36. The display circuit generates a 2.14 fH drive signal. In the presently preferred embodiment, circuits 28, 30 and 36 are embodied in an Sti7000 integrated circuit available from ST Microelectronics.

The closed loop path includes a phase detector 14. A standard 1 fH analog video signal, for example NTSC, PAL or SECAM, is an input to a digitizer and synchronizing signal separator 12. A 1 fH synchronizing signal is a first input to the phase detector 14. The drive signal generated by the display circuit 36 is fed back as a second input to the phase detector 14. The feedback path includes a branch point 42 that illustrates three different embodiments. In one embodiment path 44 leads directly to the phase detector without any modification of the drive signal. In the phase detector, the external synchronizing signal samples a fraction of pulses in the drive signal. The fraction. is related to the ratio of the first and second frequencies. In this case, the phase detector compares the phase of every 1 fH synchronizing pulse with every other pulse of the 2 fH drive signal. If the second frequency is 3 fH, for example, the external synchronizing signal samples every third pulse in the regenerated clock signal. In the case of a 1 fH input video signal, the drive signal will have a frequency of 2 fH. In a second embodiment represented by pulse width stretch circuit 46, the drive pulses are stretched, for example from a width of approximately 1 $\mu$sec to approximately 9 $\mu$sec. In a third embodiment represented by divider circuit 48, the drive signal is divided by two. The embodiments represented by circuits 46 and 48 enable the resulting phase locked loop to operate with a faster response time than when direct path 44 is utilized.

The output of the phase detector is integrated by a phase detector filter 16. The integrated output is a phase lock control voltage supplied as a second input to filter source switch 18 over line 17. The phase detector filter input represents the control signal used for 2 fH deflection.

The analog video that has been processed by digitizer 12 is supplied on lines 15 to a 1 fH to 2 fH upconversion circuit 32. The upconversion can be accomplished by doubling the number of horizontal lines, as the digitized video is read out from a memory 34. Alternatively, the upconversion can be accomplished by interpolation. The upconverted video signal is read from the memory 34 into the display circuit 36, and then supplied as a video output signal (VIDEO OUT). The upconversion circuit 32 can also be a part of the Sti7000 integrated circuit.

During operation at 2.14 fH there will be a 2.14 fH input to the phase detector 14, and there may be a 1 fH synchronizing signal also applied to the phase detector 14, even if the 1 fH signal is not selected for display. However, the filter source switch will at that time be supplying the MPEG2 system clock control voltage to the oscillator and the output of the phase detector 14, if any, will be effectively ignored.

When the system supplies the 2 fH drive signal instead of the 2.14 fH drive signal the oscillator operates at the same clock frequency. Instead of changing the oscillator frequency, the operation of the clock generation and counters circuit 28 is modified to change the number of samples during blanking. The significant difference is that the 2 fH drive signal and the 1 fH input signal are phase locked.

Figure 4:
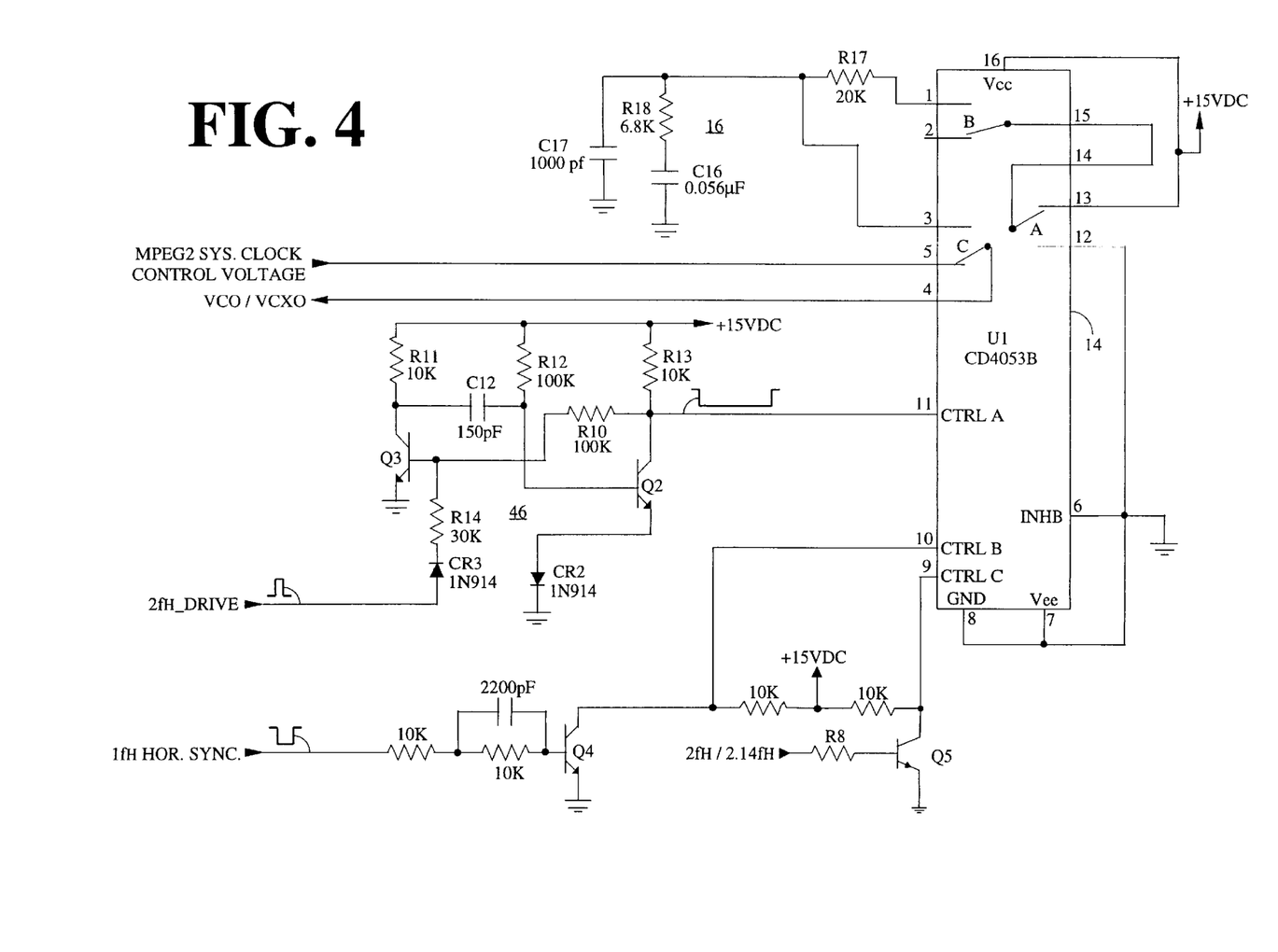
FIG. 4 is a circuit diagram explaining the operation of the phase detector and source switch in FIG. 3.

FIG. 4 illustrates a circuit schematic for implementing various parts of the system 100 shown in FIG. 3. This embodiment advantageously utilizes the phase detector shown in FIG. 1, thus reducing the number of components by having the output of the phase detector directly generate the range of 0 to 15 volts required for the VCXO varactors. Moreover, the filter source switch 18 can also be advantageously embodied in the analog multiplexer embodying the phase detector.

The phase detector 14 and the integrator filter 16 are connected as explained in connection with FIG. 1, with the following exceptions. The integrated control voltage is coupled to one input contact of switch C, pin 3. The other input contact of switch C, pin 5, is coupled to the MPEG2 system clock control voltage from BRM filter 24. Switch C is controlled by transistor Q5, responsive to the 2 fH/2.14 fH control signal from the μP 26. Switch C, advantageously part of U1, acts as filter source switch 18. The 2 fH drive signal is an input to a pulse width stretch circuit 46 embodied as a component one-shot circuit formed by transistors Q2 and Q3. The values of resistors R10, R11, R12, R13 and R14 are chosen to provide an approximately 9 μsec output pulse responsive to an approximately 1 μsec input pulse. The stretched pulse is an input to the control pin 11, for operating switch A.

Switch A is switched between +15 volts on pin 13 and ground on pin 12 at a 2 fH rate based on the deflection. Switch B is controlled by transistor Q4 responsive to the 1 fH synchronizing component. Switch C switches the voltage applied to the VCXO varactors between the phase detector output for 1 fH video signal upconversion operation and the BRM output used in normal MPEG2 decoding.

Figure 5:
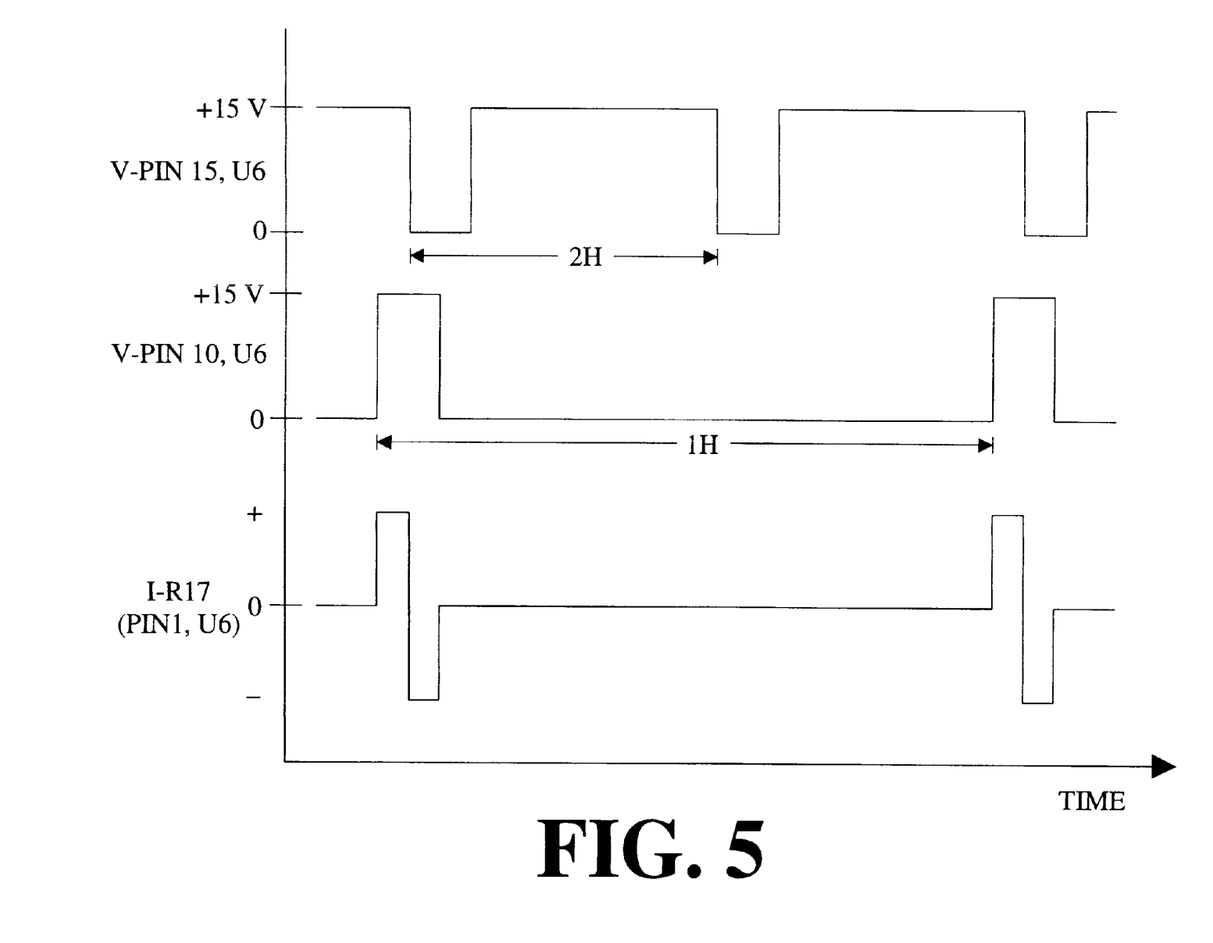
FIG. 5 illustrates waveforms useful for explaining operation of the phase detector in FIG. 3.

FIG. 5 illustrates the voltage at pin 15, the voltage at pin 10 and the current at through resistor R17, which is also the current at pin 1. It can be seen that the 1 fH signal on pin 10 samples every other pulse of the 2 fH signal on pin 15, thus causing the positive and negative currents at resistor R17/pin 1. The integrated current at pin 3 need not be scaled to drive the varactors of a VCO or VCXO.

It will be appreciated that the phase detector taught herein can be used in phase locked loops to synchronize an oscillator to external synchronizing signals other than horizontal synchronizing components in video signals.

What is claimed is:

1. A phase locked loop, comprising:

means for generating a clock signal;

means requiring a control signal having a given bias voltage for controlling said clock signal generating means;

an integrator for developing said control signal;

a source of an external synchronizing signal;

first and second voltage sources defining a voltage potential related to said given bias voltage;

a first switch coupled to said first and second voltage sources and responsive to said clock signal for developing a regenerated clock signal having a peak to peak voltage determined by said voltage potential; and, a second switch responsive to said external synchronizing signal for periodically sampling portions of said regenerated clock signal and coupling said sampled portions to said integrator, said sampled portions charging and discharging said integrator to generate said control signal with a large enough magnitude to provide said given bias voltage, whereby said first and second switches form a phase detector for synchronizing said clock signal generating means to said external synchronizing signal.

2. The phase locked loop of claim 1, wherein:

said external synchronizing signal has a first frequency;

said clock signal generating means operates at said first frequency; and, said second switch samples substantially every pulse of said regenerated clock signal.

3. The phase locked loop of claim 1, wherein:

said external synchronizing signal has a first frequency;

said clock signal generating means operates at a second frequency higher than said first frequency; and, said second switch samples a fraction of pulses in said regenerated clock signal, said fraction being related to the ratio of said first and second frequencies.

4. The phase locked loop of claim 1, wherein:

said external synchronizing signal is a horizontal synchronizing signal having a frequency of $f_H$;

said clock signal generating means operates at a frequency of $nf_H$, where n>2 and n is an integer; and, said second switch samples every $n^{th}$ pulse of said regenerated clock signal.

5. The phase locked loop of claim 1, wherein said first and second switches are analog semiconductor switches.

6. The phase locked loop of claim 5, wherein said first and second switches are embodied in an integrated circuit.

7. The phase locked loop of claim 1, wherein said first and second switches are embodied in an integrated circuit.

8. The phase locked loop of claim 1, wherein:

said means for generating said clock signal comprises a controllable oscillator; and, said means requiring said control signal having said given bias voltage for controlling said clock signal generating means comprises a varactor responsive to said control signal.

9. A phase locked loop, comprising:
  means requiring a control signal having a given bias voltage for generating a clock signal;
  an integrator for developing a first control signal;
  a source of a second control signal;
  a source of an external synchronizing signal;
  first and second voltage sources defining a voltage potential related to said given bias voltage;
  a first switch coupled to said first and second voltage sources and responsive to said clock signal for developing a regenerated clock signal having a peak to peak voltage determined by said voltage potential;
  a second switch responsive to said external synchronizing signal for periodically sampling portions of said regenerated clock signal and coupling said sampled portions to said integrator, said sampled portions charging and discharging said integrator to generate said control signal with a large enough magnitude to provide said given bias voltage, said first and second switches forming a phase detector; and,
  a third switch defining a first switchable path between said integrator and said clock signal generating means, and defining a second switchable path between said source of said second control voltage and said clock signal generating means, said first or said second switchable path being closed responsive to a control signal source selection signal.

10. The phase locked loop of claim 9, wherein said first control signal is coupled to said clock signal generating means for a phase locked mode of operation and said second control signal is coupled to said clock signal generating means for a phase unlocked mode of operation.

11. The phase locked loop of claim 10, wherein said source of said second control signal comprises:
  a binary rate multiplier (BRM) for setting said second control signal; and,
  a BRM filter for generating said second control signal responsive to said BRM.

12. The phase locked loop of claim 9, wherein:
  said horizontal synchronizing component has a frequency of $f_H$;
  said clock signal generating means operates at a frequency of $nf_H$ responsive to said first control signal in a first mode and operates at a frequency of $mf_H$ responsive to said second control signal in a second mode, where $n \geq 2$, $m \geq 2$ and n is an integer; and,
  said second switch samples every $n^{th}$ pulse of said regenerated clock signal in said first mode of operation.

13. The phase locked loop of claim 12, wherein n=2, and m>2.

14. The phase locked loop of claim 9, wherein said first, second and third switches are analog semiconductor switches.

15. The phase locked loop of claim 14, wherein said first, second and third switches are embodied in an integrated circuit.

16. The phase locked loop of claim 9, wherein said first, second and third switches are embodied in an integrated circuit.

17. A phase locked loop, comprising:
  an integrator for developing a control voltage;
  an oscillator;
  a varactor for controlling said oscillator responsive to said control voltage, said varactor requiring a given bias voltage;
  a source of a horizontal synchronizing signal;
  first and second voltage sources defining a voltage potential related to said given bias voltage;
  a first switch coupled to said first and second voltage sources and responsive to said oscillator for developing a regenerated oscillator signal having a peak to peak voltage determined by said voltage potential; and,
  a second switch responsive to said horizontal synchronizing signal for periodically sampling portions of said regenerated oscillator signal and coupling said sampled portions to said integrator, said sampled portions charging and discharging said integrator to generate said control voltage with a large enough magnitude to provide said given bias voltage,
  whereby said first and second switches form a phase detector for synchronizing said oscillator to said horizontal synchronizing signal.

18. The phase locked loop of claim 17, wherein said first and second switches are analog semiconductor switches.

19. The phase locked loop of claim 18, wherein said first and second switches are embodied in an integrated circuit.

20. The phase locked loop of claim 17, wherein said first and second switches are embodied in an integrated circuit.

21. A phase locked loop, comprising:
  an integrator for developing a first control voltage;
  a source of a second control voltage;
  an oscillator;
  a varactor for controlling said oscillator responsive to said control voltage, said varactor requiring a given bias voltage;
  a source of a horizontal synchronizing signal;
  first and second voltage sources defining a voltage potential related to said given bias voltage
  a first switch coupled to said first and second voltage sources and responsive to said oscillator for developing a regenerated oscillator signal having a peak to peak voltage determined by said voltage potential;
  a second switch responsive to said horizontal synchronizing signal for periodically sampling portions of said regenerated oscillator signal and coupling said sampled portions to said integrator, said sampled portions charging and discharging said integrator to generate said control voltage with a large enough magnitude to provide said given bias voltage, said first and second switches forming a phase detector for synchronizing said oscillator to said horizontal synchronizing signal; and,
  a third switch defining a first switchable path between said integrator and said varactor, and defining a second switchable path between said source of said second control voltage and said varactor, said first or said second switchable path being closed responsive to a control voltage source selection signal.

22. The phase locked loop of claim 21, wherein said first control voltage is coupled to said varactor for a phase locked mode of operation and said second control voltage is coupled to said varactor for a phase unlocked mode of operation.

23. The phase locked loop of claim 21, wherein:
  said horizontal synchronizing signal has a frequency of $f_H$;

said oscillator operates at a frequency of nf$_H$ responsive to said first control signal in a first mode and operates at a frequency of mf$_H$ responsive to said second control signal in a second mode, where n≧2, m≧2 and n is an integer; and, said second switch samples every n$^{th}$ pulse of said regenerated clock signal in said first mode of operation.

24. The phase locked loop of claim 23, wherein n=2, and m>2.

25. The phase locked loop of claim 21, wherein said first, second and third switches are analog semiconductor switches embodied in an integrated circuit.

* * * * *